US006335285B1

(12) United States Patent
Chun et al.

(10) Patent No.: US 6,335,285 B1
(45) Date of Patent: Jan. 1, 2002

(54) METHOD FOR MANUFACTURING A GLOBALLY PLANARIZED SEMICONDUCTOR DEVICE

(75) Inventors: Kwang-youl Chun, Kyungki-do; Jun-yong Noh, Incheon; Yoon-jae Lee, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/260,804

(22) Filed: Mar. 2, 1999

(30) Foreign Application Priority Data

Mar. 10, 1998 (KR) ............................................. 98-7904

(51) Int. Cl.7 ............................................ H01L 21/461
(52) U.S. Cl. ..................... 438/692; 438/700; 438/724; 438/740; 438/749
(58) Field of Search ................................. 438/692, 700, 438/724, 740, 744

(56) References Cited

U.S. PATENT DOCUMENTS 5,874,756 A * 2/1999 Ema et al. .................. 257/296
5,943,581 A * 8/1999 Lu et al. ..................... 438/386
6,010,933 A * 1/2000 Cherng ........................ 438/253

* cited by examiner

*Primary Examiner*—Robert Kunemund
*Assistant Examiner*—Vanessa Perez-Ramos
(74) *Attorney, Agent, or Firm*—Volentine Francos, PLLC

(57) ABSTRACT

There is provided a method for manufacturing a semiconductor device which can provide global planarization between a cell array region and a periphery region by a simple process. An interlevel dielectric layer is formed over the entire surface of a semiconductor substrate where a global step difference exists between a cell array region and a periphery region. A first material layer serving as a stopper is formed on the interlevel dielectric layer. A contact hole partially exposing the semiconductor substrate of the cell array region is formed by patterning the first material layer and the interlevel dielectric layer. A conductive layer is formed over the entire surface of the semiconductor substrate where the contact hole is formed. Global planarization is provided between the cell array region and the periphery region by performing a chemical mechanical polishing (CMP) process on the semiconductor substrate where the conductive layer is formed.

20 Claims, 5 Drawing Sheets

METHOD FOR MANUFACTURING A GLOBALLY PLANARIZED SEMICONDUCTOR DEVICE

BACKGROUND OF THE INVENTION

1. Field of the Invention

The present invention relates to a method for manufacturing a semiconductor device, and more particularly, to a method for manufacturing a semiconductor device providing global planarization between a cell region and a periphery region using a chemical mechanical polishing (CMP) process.

2. Description of the Related Art

The semiconductor device has entered an era of ultra-large-scale integration (ULSI) represented by 256 megabit DRAMs or 1 gigabit DRAMs toward high function, high performance and high integration. Since finer pattern formation technology is necessary for high integration of devices and three-dimensional multiple layered structures are required in various fields, introduction of new processes are being examined.

When ultra-fine interconnection lines are multilayered by a pattern formation technology, it is necessary to planarize an interlevel dielectric layer being under the interconnection lines. To this end, partial planarization has been employed. However, to enhance wafer fabrication performance or manufacture of high quality products, a chemical mechanical polishing (CMP) process for planarization throughout the entire surface of a wafer, i.e., global planarization, needs to be introduced.

In manufacturing a semiconductor device, the cases of forming fine patterns on a complete planar silicon substrate, and forming fine patterns on an uneven substrate formed by already existing patterns, are quite different. The presence of unevenness causes inhomogeneity in an interface between the substrate and a mask, and makes it impossible to attain a desirable pattern preciseness. Thus, various measures for partially alleviating unevenness have been taken.

FIGS. 1 through 3 are cross-sectional views for illustrating a conventional method for planarizing a cell array region and a periphery region using a chemical mechanical polishing process.

First, referring to FIG. 1, an isolation layer 4 for defining an active region and a field region is formed on a semiconductor substrate 2 containing a cell array region and a periphery region using a conventional isolation technology. Next, a transistor comprised of a gate insulation layer (not shown), gate electrodes 6 and 8, and source/drain (not shown) is formed in the active region of the semiconductor substrate 2.

Subsequently, an insulation material, e.g., silicon nitride, is deposited on the semiconductor substrate where the transistor is formed, and then an insulation layer 10 having a space is formed. The insulation layer 10 is for forming a contact hole in a self-aligning manner during a subsequent step.

Next, an insulation material providing easy planarization, e.g., boron phosphorus silicate glass (BPSG), is deposited over the entire surface of the semiconductor substrate having the insulation layer 10, and then thermally treated at a predetermined temperature to form an interlevel dielectric layer 12. Next, a CMP process is performed on the interlevel dielectric layer 12 to planarize the same. The part indicated by the dotted line represents an interlevel dielectric layer before being planarized.

Referring to FIG. 2, a photoresist pattern (not shown) is formed on the planarized interlevel dielectric layer 12 and then the interlevel dielectric layer 12 is patterned using the photoresist pattern as a mask, thereby forming a contact hole 14 exposing a source or drain region (not shown) of the semiconductor substrate 2.

Referring to FIG. 3, a conductive material, e.g., an impurity-doped polysilicon layer, is deposited on the resultant structure having the contact hole, and then the polysilicon of the periphery region is removed. Next, a CMP process is performed on the polysilicon layer deposited on the cell array region, thereby forming a conductive pad 16 whose surface is planarized. The CMP process performed on the polysilicon layer employs the interlevel dielectric layer 12 as a stopper. The part indicated by the dotted line represents a polysilicon layer before being planarized.

According to the conventional method, a step difference between the cell array region and the periphery region is removed by performing the CMP process twice, thereby providing global planarization. However, the conventional method for manufacturing a semiconductor device consists of deposition and flow of an interlevel dielectric layer, a first CMP process for the interlevel dielectric layer, contact formation, deposition of a polysilicon layer, and a second CMP process for a pad polysilicon layer, that is, two CMP processes are necessary. Thus, the manufacturing process is complicated, and several defects, i.e., micro scratches on a substrate due to repeated CMP processes, or bridges due to the micro scratch, may be generated.

SUMMARY OF THE INVENTION

To solve the above problems, it is an objective of the present invention to provide a method for manufacturing a semiconductor device which can provide global planarization between a cell array region and a periphery region by a single CMP process.

Accordingly, to achieve the above objective, first, an interlevel dielectric layer is formed over the entire surface of a semiconductor substrate where a global step difference exists between a cell array region and a periphery region. A first material layer serving as a stopper is formed on the interlevel dielectric layer. A contact hole partially exposing the semiconductor substrate of the cell array region is formed by patterning the first material layer and the interlevel dielectric layer. A conductive layer is formed over the entire surface of the semiconductor substrate where the contact hole is formed. Global planarization is provided between the cell array region and the periphery region by performing a chemical mechanical polishing (CMP) process on the semiconductor substrate where the conductive layer is formed.

When forming the interlevel dielectric layer, a flowable insulation layer, e.g., boron phosphorus silicate glass (BPSG), is deposited over the entire surface of the semiconductor substrate where the global step difference exists between the cell array region and the periphery region, and the insulation layer is flowed by thermally treating the same at a predetermined temperature.

The first material layer is preferably formed of a silicon nitride layer or a silicon oxynitride layer, and is preferably formed to a thickness of 50~2,000Å. Also, the conductive layer is preferably formed of a polysilicon layer. Preferably, the step of etching back the conductive layer is followed by the step of forming the conductive layer. Here, the step of etching back the conductive layer is preferably performed until the conductive layer formed in the periphery region is removed.

The CMP process is performed under the condition that an etching selectivity of the interlevel dielectric layer to the conductive layer to the first material layer is 100–200:100–200:5–50. Here, the CMP process is preferably performed using the first material layer of the periphery region as a stopper. Otherwise, the CMP process is preferably performed until the first material layer of the periphery region is removed.

Also, before forming the interlevel dielectric layer, the method according to the present invention further comprises the steps of sequentially forming a gate insulation layer and gate electrodes on the semiconductor substrate, //forming a source/drain on the semiconductor substrate using the gate electrodes as a mask, and //forming a spacer at side walls of the gate electrodes. The gate electrodes are formed by depositing polysilicon and silicide, and the spacer is preferably formed of a silicon nitride layer.

According to the present invention, a stopper layer is formed using a material which can suppress a CMP process on the interlevel dielectric layer, thereby achieving global planarization between the cell array region and the periphery region by a single CMP process.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
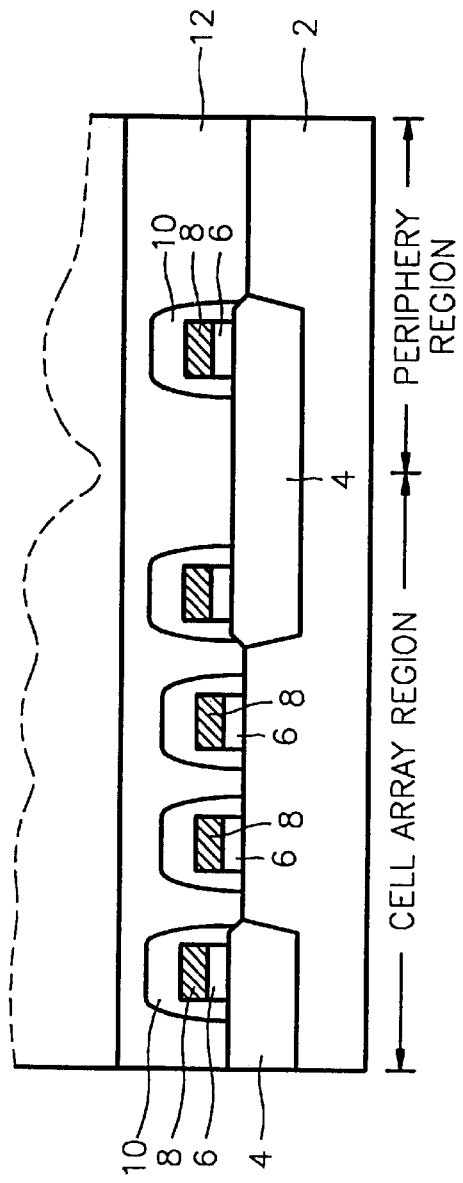
FIGS. 1 through 3 are cross-sectional views illustrating a conventional method for planarizing a cell array region and a periphery region.
Figure 2:
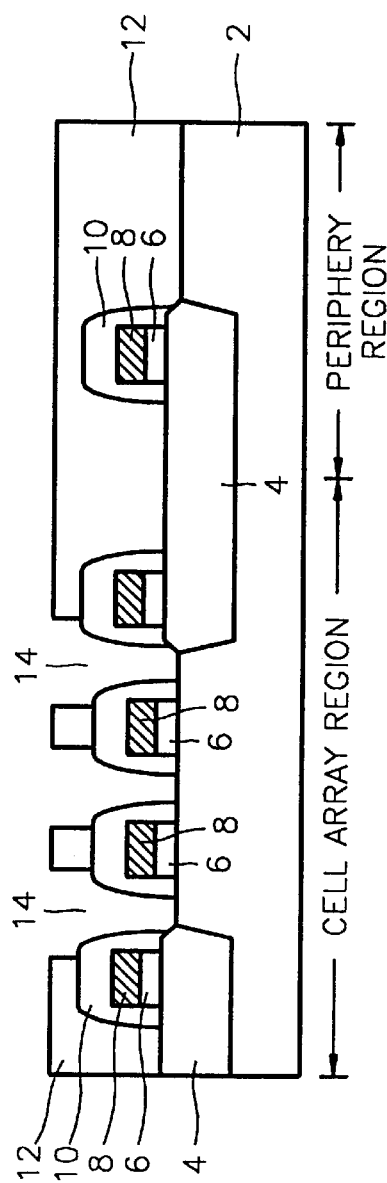
Figure 3:
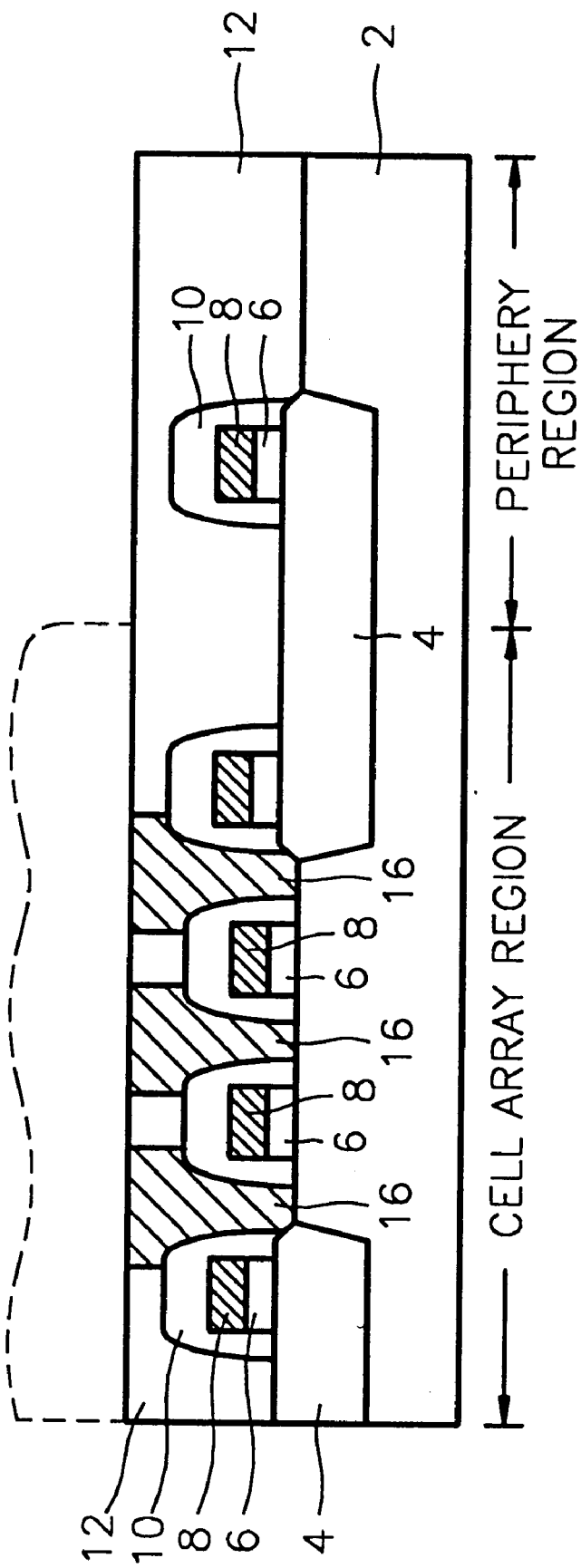

Hereinbelow, the present invention will be described in more detail with reference to the accompanying drawings.

The present invention is implemented in various forms but is not limited to the following embodiments. These embodiments are provided only for perfecting the disclosure of the invention and making the scope of the invention known to those who have ordinary skills in the art. Throughout the drawings, components of various devices, a positional relationship therebetween and thicknesses of various films and areas are emphasized for clarity. In the drawings, the same elements are designated by the same numbers. Also, in the case when it is described that a certain layer exists "on" another layer or substrate, the certain layer may exist directly on another layer or substrate or a third layer may be interposed therebetween.

FIGS. 4 through 7 are cross-sectional views illustrating a method for manufacturing a globally planarized semiconductor device according to the present invention.

Figure 4:
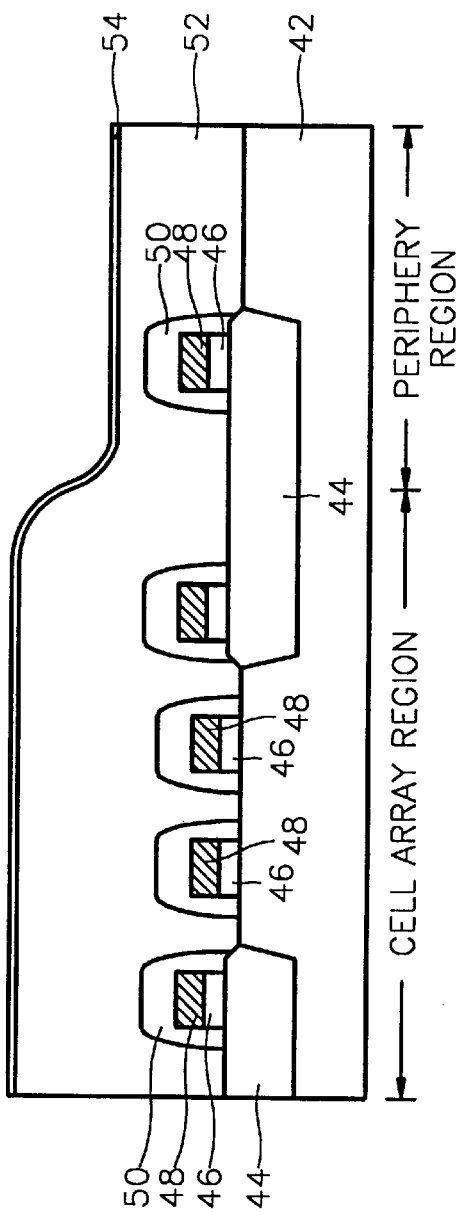
FIGS. 4 through 7 are cross-sectional views illustrating a method for manufacturing a globally planarized semiconductor device according to the present invention.

Referring to FIG. 4, an isolation layer 44 for defining an active region and a field region is formed on a semiconductor substrate 42 containing a cell array region and a periphery region using a conventional isolation technology. Next, a transistor comprised of a gate insulation layer (not shown), gate electrode 46 and 48, and a source/drain (not shown) is formed in the active region.

The gate electrode 46 and 48 may be formed of an impurity-doped polysilicon layer 46. Otherwise, to enhance the operational speed of a device, the gate electrode 46 and 48 may be formed by depositing a low-resistance conductive material, e.g., tungsten silicide (WSI) 48, on the polysilicon layer 46.

Subsequently, an insulation material, e.g., silicon nitride, is deposited on the semiconductor substrate where the transistor is formed, and then an insulation layer 50 having a spacer is formed. The insulation layer 50 is for forming a contact hole in a self-aligning manner during a subsequent step.

Next, an insulation material providing easy planarization, e.g., boron phosphorus silicate glass (BPSG), is deposited over the entire surface of the semiconductor substrate having the insulation layer 50, and then thermally treated at a predetermined temperature to form an interlevel dielectric layer 52.

In contrast to the conventional process, wherein the conventional interlevel dielectric layer had been formed thick in consideration of the primary CMP process, in the present invention the interlevel dielectric layer 52 is formed to be thin —just thick enough so that the gate electrodes of the periphery region are not exposed.

Next, a material which can serve as a stopper in the CMP process in which the interlevel dielectric layer and the polysilicon layer are etching targets, e.g., a silicon nitride layer (SiN) or a silicon oxynitride layer (SiON), is deposited over the entire surface of the interlevel dielectric layer 52 to a predetermined thickness, thereby forming a stopping layer 54.

The silicon nitride layer (SiN) may be deposited by a low pressure chemical vapor deposition (LPCVD) method, and the silicon oxynitride layer (SION) may be deposited by a plasma enhanced chemical vapor deposition (PECVD) method or LPCVD method. These layers are preferably formed to a thickness of 50~2,000Å.

The stopping layer 54 increases the photolithography margin in a subsequent self aligned contact (SAC) forming process, and serves as a selective stopper for the periphery region in a subsequent CMP process.

Figure 5:
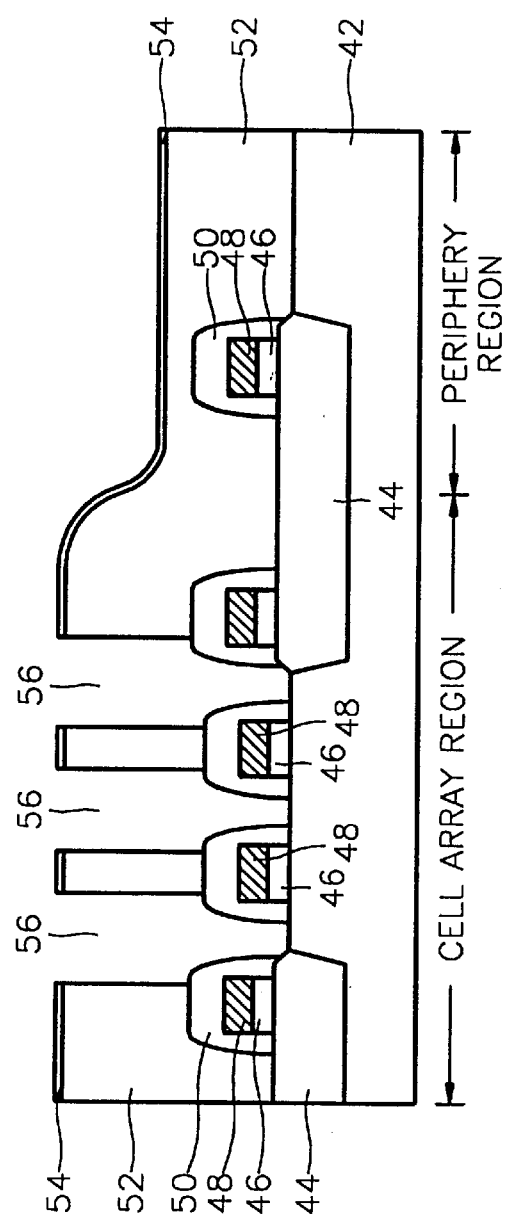

Referring to FIG. 5, a photoresist pattern is coated on the stopping layer 54 and then exposure and development are performed thereon to form a photoresist pattern. The stopping layer 54 and the interlevel dielectric layer 52 are sequentially patterned using the photoresist film as a mask, thereby forming a contact hole 56 exposing a source or drain region (not shown) of the semiconductor substrate.

Figure 6:
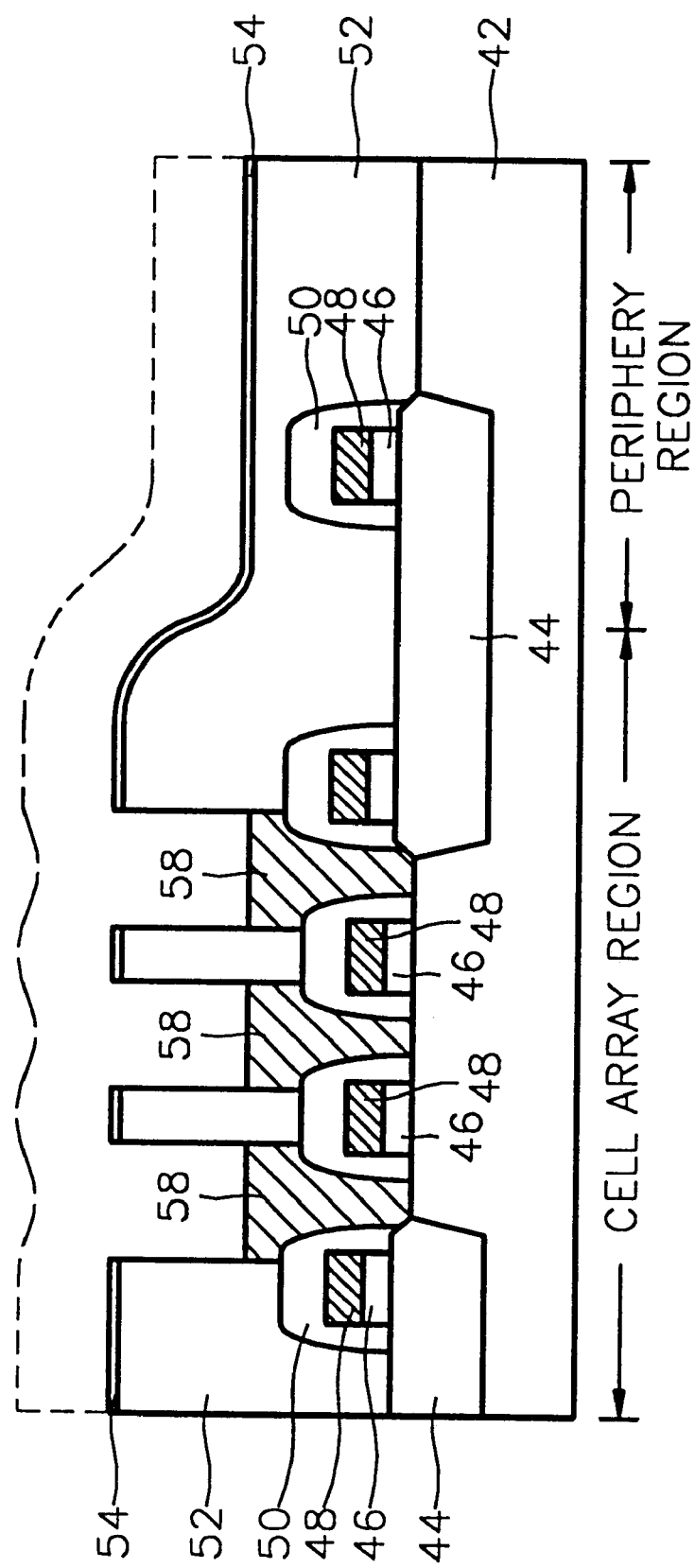

Referring to FIG. 6, a conductive material for forming a pad, e.g., an impurity-doped polysilicon layer 58, is deposited on the resultant structure having the contact hole to a thickness sufficient to fill the contact hole. Next, the polysilicon layer is etched back to recess the same to a predetermined depth. At this time, the etch-back process for the polysilicon layer 58 is performed until the polysilicon layer of the periphery region is completely removed and the surface of the stopping layer 54 is exposed. Then, the polysilicon layer thicker than the pad to be formed remains in the cell array region. A part indicated by the dotted line represents the polysilicon layer before being etched back.

Figure 7:
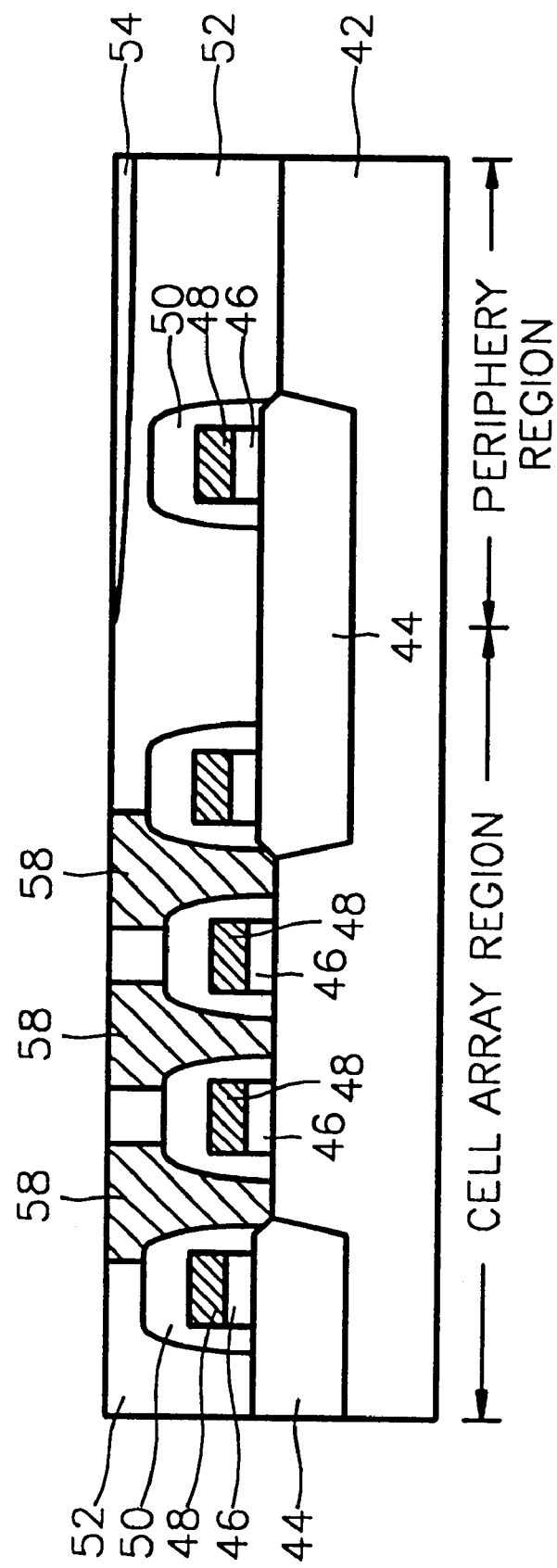

Referring to FIG. 7, in a state where a global step difference exists between the cell array region and the periphery region, a CMP process is performed on the resultant structure. The CMP process is performed under conditions in which there is little selectivity between the interlevel dielectric layer 52 and the polysilicon layer 58, and the selectivity between these layers 52 and 58 and the stopping layer 54 is made large, preferably, in the range of 100–200:100–200:5–50.

Since the stopping layer 54 having a low etching ratio is formed comparatively thinly in the cell array region having a high step difference, the stopping layer 54 is removed when the CMP process is performed to some extent under the above-described conditions, and then the CMP process is performed faster than ever. When the CMP process is performed to some extent, the surface of the stopping layer in the periphery region is exposed. Since the stopping layer is formed wide in the periphery region, when the surface of the stopping layer is exposed, the CMP process is terminated and overall global planarization is provided.

The stopping layer of the periphery region may be completely removed by further performing the CMP process.

According to the method for manufacturing the globally planarized semiconductor device of the present invention, when a global step difference exists between the cell array region and the periphery region and the step difference is removed using a CMP process to attain global planarization, a stopping layer is formed which can suppress the CMP process on an interlevel dielectric layer. A SAC process is performed after forming the stopping layer, and a CMP process is performed after forming a pad conductive layer under the conditions that there is little selectivity between the interlevel dielectric layer and the conductive layer and the selectivity between these layers and the stopping layer is made large. Then, the stopping layer lowers a CMP progress rate for the periphery region, thereby providing global planarization between the cell array region and the periphery region by a single CMP process. Therefore, since the CMP process is performed just once, unlike the conventional process in which the CMP process is performed twice, the manufacturing process is simplified and productivity is improved. Also, several defects due to micro scratches being generated during the CMP process can be reduced.

What is claimed is:

1. A method of manufacturing a globally planarized semiconductor device comprising:

forming an interlevel dielectric layer over an entire surface of a semiconductor substrate where a global step difference exists between a cell array region and a periphery region;

forming a first material layer serving as a stopper on the interlevel dielectric layer;

forming a contact hole partially exposing the semiconductor substrate in the cell array region by patterning the first material layer and the interlevel dielectric layer;

forming a conductive layer over the entire surface of the semiconductor substrate where the contact hole is formed; and providing global planarization of the cell array region and the periphery region by performing a chemical mechanical polishing (CMP) process on the semiconductor substrate where the conductive layer is formed.

2. The method according to claim 1, wherein said forming of the interlevel dielectric layer comprises:

depositing a flowable insulation layer over the entire surface of the semiconductor substrate where the global step difference exists between the cell array region and the periphery region; and flowing the insulation layer by thermally treating the insulation layer at a temperature.

3. The method according to claim 2, wherein the interlevel dielectric layer is formed of boron phosphorus silicate glass (BPSG).

4. The method according to claim 1, wherein the first material layer is formed of one selected from a group consisting of a silicon nitride layer and a silicon oxynitride layer.

5. The method according to claim 4, wherein the first material layer is formed to a thickness of 50~2,000Å.

6. The method according to claim 1, wherein the conductive layer is formed of a polysilicon layer.

7. The method according to claim 6, wherein the polysilicon layer is etched to form the conductive layer.

8. The method according to claim 7, wherein the etching is performed until the conductive layer formed in the periphery region is removed.

9. The method according to claim 1, wherein the CMP process is performed under a condition that an etching selectivity of the interlevel dielectric layer to the conductive layer to the first material layer is 100~200:100~200:5~50.

10. The method according to claim 1, wherein the CMP process is performed using the first material layer of the periphery region as a stopper.

11. The method according to claim 1, wherein the CMP process is performed until the first material layer of the periphery region is removed.

12. The method according to claim 1, wherein before forming the interlevel dielectric layer, the method further comprises:

sequentially forming a gate insulation layer and gate electrodes on the semiconductor substrate;

forming a source/drain on the semiconductor substrate using the gate electrodes as a mask; and forming a spacer at side walls of the gate electrodes.

13. The method according to claim 12, wherein the gate electrodes are formed by depositing polysilicon and silicide, and the spacer is formed of a silicon nitride layer.

14. A global planarization process for a semiconductor device comprising:

forming an interlevel dielectric layer over a surface of a semiconductor substrate including a cell array region and a peripheral region, a global step difference existing between the cell array region and the peripheral region;

forming a material layer on the interlevel dielectric layer;

forming a contact hole through the material layer and the interlevel dielectric layer to the semiconductor substrate;

forming a conductive layer on the semiconductor substrate within the contact hole; and globally planarizing the interlevel dielectric layer and the conductive layer in the cell array region using a single chemical mechanical polishing (CMP) process, the material layer in the peripheral region serving as a polishing stop layer.

15. The global planarization process of claim 14, wherein said forming of the conductive layer comprises:

depositing a conductive material in the contact hole and on the material layer; and etching the conductive material within the contact hole until the conductive material on the material layer in the peripheral region is removed.

16. The global planarization process of claim 15, wherein the conductive material is polysilicon.

17. The global planarization process of claim 14, wherein the material layer formed on the interlevel dielectric layer in the peripheral region is thicker than the material layer on the interlevel dielectric layer in the cell array region.

18. The global planarization process of claim 14, wherein a CMP selectivity ratio of the interlevel dielectric layer to the conductive layer to the material layer is 100~200:100~200:5~50.

19. The global planarization process of claim 14, wherein the interlevel dielectric layer is boron phosphorus silicate glass (BPSG).

20. The global planarization process of claim 14, wherein the material is selected from a group consisting of silicon nitride and silicon oxynitride.

* * * * *